(12) United States Patent
Ibrahim et al.

(10) Patent No.: US 8,081,714 B2
(45) Date of Patent: Dec. 20, 2011

(54) METHOD AND SYSTEM FOR REUSE OF CORDIC IN AN RF TRANSCEIVER BY RECONFIGURATION IN REAL TIME

(75) Inventors: Brima Ibrahim, Aliso Viejo, CA (US); Hea Joung Kim, Irvine, CA (US); Henrik Tholstrup Jensen, Long Beach, CA (US); Paul Lettieri, Lake Forest, CA (US); Siukai Mak, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 2119 days.

(21) Appl. No.: 10/989,536

(22) Filed: Nov. 16, 2004

(65) Prior Publication Data
US 2006/0093070 A1 May 4, 2006

Related U.S. Application Data

(60) Provisional application No. 60/624,019, filed on Nov. 1, 2004.

(51) Int. Cl.
*H04L 27/00* (2006.01)

(52) U.S. Cl. ........ 375/324; 375/322; 375/329; 375/315; 375/345

(58) Field of Classification Search ................. 375/324, 375/322, 329, 315, 345, 311, 347; 455/214
See application file for complete search history.

(56) References Cited

U.S. PATENT DOCUMENTS

| | | | | |
|---|---|---|---|---|
| 5,784,414 A * | 7/1998 | Bruekers et al. | | 375/324 |
| 5,852,630 A * | 12/1998 | Langberg et al. | | 375/219 |
| 6,192,089 B1 * | 2/2001 | Corleto et al. | | 375/344 |
| 6,640,093 B1 * | 10/2003 | Wildhagen | | 455/130 |
| 6,940,837 B1 * | 9/2005 | Kotake | | 370/335 |
| 7,039,130 B2 * | 5/2006 | Hurley | | 375/326 |
| 7,228,113 B1 * | 6/2007 | Tang et al. | | 455/101 |
| 7,254,186 B2 * | 8/2007 | Liu | | 375/316 |
| 7,313,196 B1 * | 12/2007 | Hall et al. | | 375/296 |
| 7,545,878 B1 * | 6/2009 | Hall et al. | | 375/285 |
| 7,545,885 B2 * | 6/2009 | Puma et al. | | 375/316 |
| 2002/0015458 A1 * | 2/2002 | Van Sinderen | | 375/345 |
| 2002/0051503 A1 * | 5/2002 | Takahiko | | 375/327 |
| 2002/0145971 A1 * | 10/2002 | Cho et al. | | 370/208 |
| 2002/0154678 A1 * | 10/2002 | Doetsch et al. | | 375/130 |
| 2004/0161026 A1 * | 8/2004 | Jensen et al. | | 375/224 |
| 2004/0161055 A1 * | 8/2004 | Sinha | | 375/322 |

(Continued)

OTHER PUBLICATIONS

Steven Hall, "Radio Frequency change Request for Medium rate IP, Bluetooth Specification V 1.2", 2003.*

*Primary Examiner* — Shuwang Liu
*Assistant Examiner* — Helene Tayong
(74) *Attorney, Agent, or Firm* — Thomas, Kayden, Horstemeyer & Risley, LLP

(57) ABSTRACT

Methods and systems for processing an RF signal are disclosed herein. Aspects of the method may comprise utilizing a single input CORDIC and a single output CORDIC for synchronizing and demodulating a received signal, wherein the received signal may comprise one or more bit rates. The received signal may comprise a one megabit per second (Mbps) signal. The single input CORDIC may be configured to operate in a rotating mode and the single output CORDIC may be configured to operate in a rotating mode and/or an arctangent (ARCTAN) mode. A rotated output of the single input CORDIC may be correlated with a phase shift keying (PSK) synchronization (sync) word and a portion of the correlated rotated output of the single input CORDIC may be buffered.

57 Claims, 7 Drawing Sheets

U.S. PATENT DOCUMENTS

| | | | |
|---|---|---|---|
| 2005/0018790 A1* | 1/2005 | Liu | 375/316 |
| 2005/0157636 A1* | 7/2005 | Wen et al. | 370/203 |
| 2006/0050816 A1* | 3/2006 | Yang et al. | 375/346 |
| 2006/0146962 A1* | 7/2006 | Troya et al. | 375/340 |

* cited by examiner

METHOD AND SYSTEM FOR REUSE OF CORDIC IN AN RF TRANSCEIVER BY RECONFIGURATION IN REAL TIME

CROSS-REFERENCE TO RELATED APPLICATIONS/INCORPORATION BY REFERENCE

This application makes reference to, claims priority to, and claims the benefit of U.S. Provisional Application Ser. No. 60/624,019 filed Nov. 1, 2004 and entitled "Method And System For Reuse Of CORDIC In An RF Transceiver By Reconfiguration In Real Time."

This application makes reference to:

U.S. application Ser. No. 10/134,797 entitled "Radio receiver having direct DC offset compensation" filed Apr. 29, 2004;

U.S. Provisional Patent Application Serial No. 60/623,963 filed Nov. 1, 2004;

U.S. Provisional Patent Application Serial No. 60/623,962 filed Nov. 1, 2004;

U.S. Provisional Patent Application Serial No. 60/624,012 filed Nov. 1, 2004;

U.S. Provisional Patent Application Serial No. 60/624,013 filed Nov. 1, 2004;

U.S. Provisional Patent Application Serial No. 60/624,011 filed Nov. 1, 2004; and U.S. Provisional Patent Application Serial No. 60/623,956 filed Nov. 1, 2004.

The above stated applications are hereby incorporated herein by reference in their entirety.

FIELD OF THE INVENTION

Certain embodiments of the invention relate to receiving and processing radio frequency (RF) signals. More specifically, certain embodiments of the invention relate to a method and system for reuse of CORDIC in an RF transceiver by reconfiguration in real time.

BACKGROUND OF THE INVENTION

Communication systems are known to support wireless and wired communications between wireless and/or wired communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, and/or home entertainment equipment, communicates directly or indirectly with other wireless communication devices. For direct communications, also known as point-to-point communications, the participating wireless communication devices tune their receivers and transmitters to the same channel, or channels, such as one or more of the plurality of radio frequency (RF) carriers of the wireless communication system, and communicate over that channel(s). For indirect wireless communications, each wireless communication device communicates directly with an associated base station for use of cellular services, for example, and/or an associated access point for use of an in-home or in-building wireless network, for example, via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it may include a built-in radio transceiver comprising a receiver and transmitter, or it may be coupled to an associated radio transceiver, such as a station for in-home and/or in-building wireless communication networks, and/or an RF modem. The transmitter may be adapted to convert data into RF signals by modulating the data in accordance with the particular wireless communication standard to produce baseband signals and mixes the baseband signal with a local oscillator signal in one or more intermediate frequency stages to produce the RF signals. The radio receiver may include an antenna section, a filtering section, a low noise amplifier, an intermediate frequency (IF) stage, an equalization stage, and/or a demodulator. The antenna section may receive RF signals and may provide them to the filtering section, which, in turn, may pass RF signals of interest to the low noise amplifier (LNA).

The LNA may amplify the received RF signals of interest and may provide them as amplified RF signals to the IF stage. The IF stage may step down the frequency of the RF signals of interest to an intermediate frequency or to baseband. The IF stage may then provide the intermediate frequency signals, or baseband signals, to the equalization stage. The equalization stage may add loss or delay to specific frequencies to produce a flat frequency response. The equalization stage may then output an in-phase (I) and/or a quadrature (Q) component to the demodulator. The demodulator may be adapted to synchronize the signal and/or to recapture the data in accordance with a demodulation protocol.

In conventional RF transceivers, for the demodulator to accurately recover data from IF signals or baseband signals, DC offsets may need to be overcome. DC offsets in a demodulated output may result when the clock circuitry of a transmitting radio produces a slightly different clock rate than the clock rate produced by the receiving radio. The local oscillation within the transmitting radio, therefore, may not produce the exact same rate of oscillation as the rate produced by the local oscillation in the receiving radio. In addition, the RF transceiver may need to account for a phase offset during demodulation, time error detection, vector-to-angle conversion, vector-to-amplitude conversion, and/or vector rotation, for example. The conventional RF transceiver, therefore, may need to utilize a plurality of separate circuits, such as a DC offset compensation circuit, a phase offset compensation circuit, and other circuitry necessary for signal synchronization and/or demodulation. Consequently, a large number of circuits may be required for implementing a conventional RF transceiver, which may increase production costs and decrease efficiency. Additionally, a large number of circuits require a much larger silicon and increases power consumption.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for processing an RF signal. Aspects of the method may comprise utilizing a single input CORDIC and a single output CORDIC for synchronizing and demodulating a received signal, wherein the received signal may comprise one or more bit rates. The received signal may comprise a one megabit per second (Mbps) signal. The single input CORDIC may be configured to operate in a rotating mode and the single output CORDIC may be configured to operate in a rotating mode and/or an arctangent (ARCTAN) mode. A rotated output of the single input CORDIC may be correlated with a phase shift keying (PSK) synchronization (sync) word and a portion of the correlated rotated output of the single input CORDIC may be buffered.

A signal peak may be determined utilizing an amplitude output signal of the single output CORDIC, where the amplitude output signal may correspond to a portion of the correlated rotated output and/or a portion of the buffered correlated rotated output. The received signal may be rotated based on a phase offset and frequency offset of the received signal and a corresponding transmitted signal. A timing error adjustment signal and/or an angle feedback signal may be generated utilizing a rotated output of the single output CORDIC, which may be configured in a rotating mode. An output of the single input CORDIC may be rotated utilizing the angle feedback signal. A received signal strength indicator (RSSI) signal may be generated utilizing an amplitude output of the single output CORDIC, which may be configured in an ARCTAN mode.

The amplitude output of the single output CORDIC may correspond to an equalized signal input to the single output CORDIC. A phase offset of the received signal and a corresponding transmitted signal may be determined utilizing an angle output of the single output CORDIC, which may be configured in an ARCTAN mode. The angle output of the single output CORDIC may correspond to a peak signal input to the single output CORDIC. An angle generated at an output of the single output CORDIC may be filtered, and the single output CORDIC may be configured in an ARCTAN mode. The angle generated at the output of the single output CORDIC may correspond to an equalized signal input to the single output CORDIC. One or more bits may be generated utilizing an angle generated at an output of the single output CORDIC, where the plurality of bits corresponds to the received signal. The angle generated from the output of the single output CORDIC may correspond to an equalized signal input to the single output CORDIC.

Another embodiment of the invention may provide a machine-readable storage, having stored thereon, a computer program having at least one code section executable by a machine, thereby causing the machine to perform the steps as described above for processing an RF signal.

In another aspect of the invention, a system for processing an RF signal may comprise a single input CORDIC and a single output CORDIC for synchronizing and demodulating a received signal. The received signal may comprise a plurality of bit rates, for example, a one megabit per second (Mbps) signal. The single input CORDIC may be configured to operate in a rotating mode and the single output CORDIC may be configured to operate in a rotating mode and/or an arctangent (ARCTAN) mode. A correlator may correlate a rotated output of the single input CORDIC with a phase shift keying (PSK) synchronization (sync) word. A buffer may buffer a portion of the correlated rotated output of the single input CORDIC. A peak detector may be adapted to determine a signal peak utilizing an amplitude output signal of the single output CORDIC, where the amplitude output signal may correspond to at least a portion of the correlated rotated output and a portion of the buffered correlated rotated output.

The single input CORDIC may rotate the received signal based on a phase offset and frequency offset of the received signal and a corresponding transmitted signal. A timing error detector (TED) may generate a timing error adjustment signal and/or an angle feedback signal utilizing a rotated output of the single output CORDIC, which may be configured in a rotating mode. The single output CORDIC may be adapted to rotate an output of the single input CORDIC utilizing the angle feedback signal. A received signal strength indicator (RSSI) circuit may generate a received signal strength indicator signal utilizing an amplitude output of the single output CORDIC, which may be configured in an ARCTAN mode. The amplitude output of the single output CORDIC may correspond to an equalized signal input to the single output CORDIC.

An initial phase offset circuit may determine a phase offset of the received signal and a corresponding transmitted signal utilizing an angle output of the single output CORDIC, which may be configured in an ARCTAN mode. The angle output of the single output CORDIC may correspond to a peak signal input to the single output CORDIC. A filter may be utilized to filter an angle generated at an output of the single output CORDIC, which may be configured in an ARCTAN mode. The angle generated at the output of the single output CORDIC may correspond to an equalized signal input to the single output CORDIC. A PSK slicer may be adapted to generate one or more bits utilizing an angle generated at an output of the single output CORDIC, where the plurality of bits may correspond to the received signal. The angle generated from the output of the single output CORDIC may correspond to an equalized signal input to the single output CORDIC.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for signal processing. In accordance with an aspect of the invention, Coordinate Rotation Digital Computer (CORDIC) circuits may be utilized for efficient radio frequency (RF)-to-digital and digital-to-RF signal processing. CORDIC circuits may be utilized for computing a wide range of functions used during signal processing, including certain trigonometric, linear, hyperbolic, and/or logarithmic functions. More specifically, CORDIC may comprise suitable circuitry, logic and/or code and may be adapted to perform mathematical iterations on an input vector and/or angle value utilizing arctangent look-up tables. For example, a dual-CORDIC architecture may be utilized in arctangent and/or rotation modes to perform a plurality of signal processing tasks. The signal processing tasks may comprise vector-to-angle conversion, vector-to-amplitude conversion, and/or vector rotation during synchronization and/or demodulation of signals with 1, 2, and/or 3 megabits per second (mbps) data rates, for example, such as Bluetooth signals and/or other types of wireless signals. Accordingly, the use of dual-CORDIC architecture during processing of wireless signals with 1-3 mbps data rate, for example, may significantly reduced the utilized silicon on-chip real estate and increase processing speed and overall efficiency of the wireless device.

Figure 1:
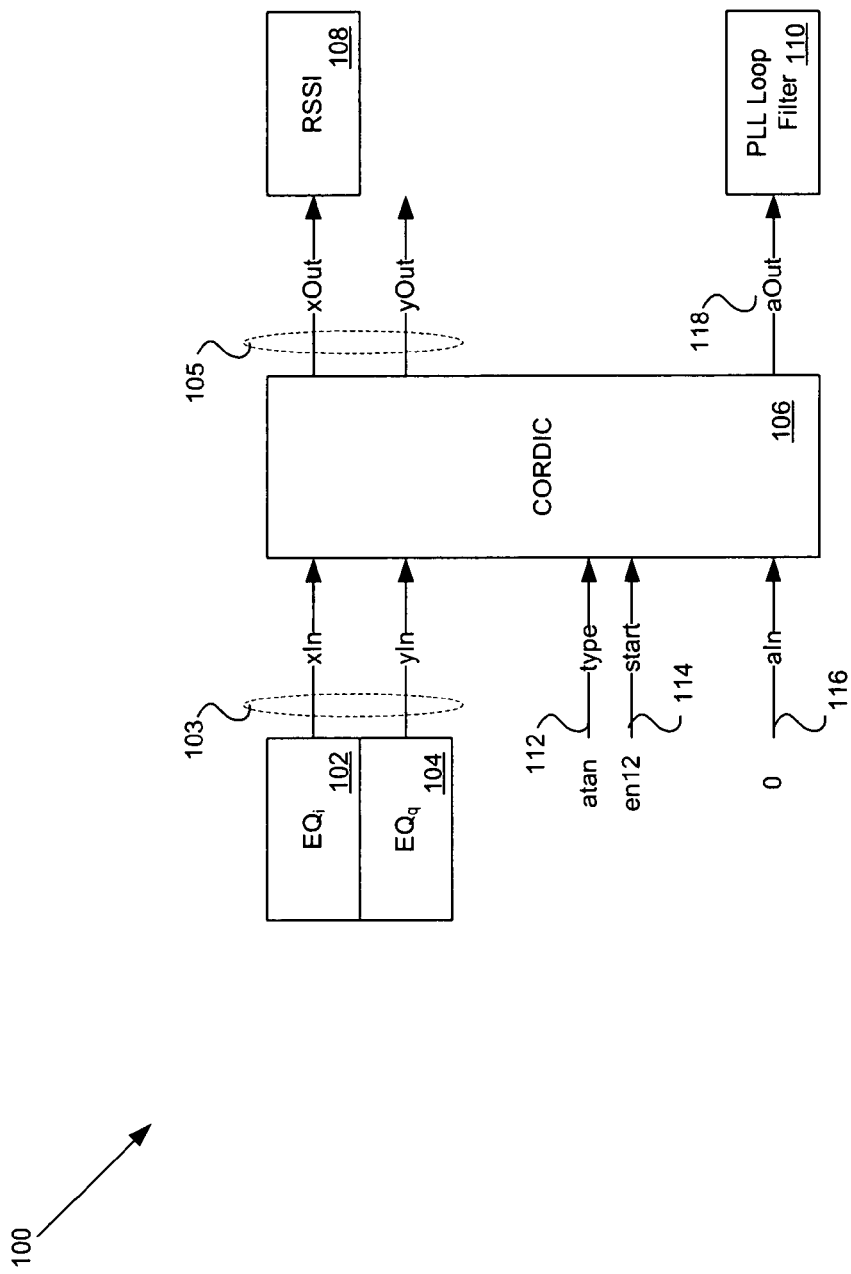
FIG. 1 is a block diagram of an exemplary circuit utilizing CORDIC processing during one megabit per second (mbps) data rate synchronization and demodulation, that may be utilized in connection with an aspect of the invention.

FIG. 1 is a block diagram of an exemplary circuit utilizing CORDIC processing during one megabit per second (mbps) data rate synchronization and demodulation, that may be utilized in connection with an aspect of the invention. Referring to FIG. 1, the signal processing circuit 100 may comprise equalizer circuits 102 and 104, a CORDIC circuit 106, a received signal strength indicator (RSSI) circuit 108, and a phase locked loop (PLL) loop filter 110. The equalizer circuits 102 and 104 may comprise suitable circuitry and/or logic and may be adapted to equalize an input signal, such as an RF signal, prior to synchronization and/or demodulation and output a vector 103. The output vector 103 may comprise an "x" and a "y" component corresponding to an in-phase (I) and a quadrature (Q) component of the equalizer circuits 102 and 104.

The CORDIC 106 may comprise suitable circuitry, logic and/or code and may be adapted to perform mathematical iterations on an input vector and/or angle value utilizing arctangent look-up tables, for example, during synchronization of one mbps data rate signals. Such synchronization may occur prior to synchronization and/or demodulation of two and/or three mbps data rate signals. The CORDIC 106 may be utilized in an arctangent mode to transform an input vector into an amplitude and/or an angle. Accordingly, the CORDIC 106 may receive as inputs vector 103, control signals 112 and 114, and an input angle 116. Vector input 103 may be acquired from equalizer circuits 102 and 104. Control signal 112 may initialize the CORDIC 106 to operate in arctangent mode. Control signal 114 may set the CORDIC 106 frequency to 12 operations per microsecond, or one CORDIC 106 operation per 12 MHz clock cycle, for example. The input angle 116 may correspond to an angle offset, such as a zero angle offset, for the output vector 105 and the output angle 118 may correspond to the angle of the output vector 105. In addition, output angle 118 may be biased in a positive or negative direction by setting the input angle 116 to a value other than zero. The output vector 105 may comprise an "x" and a "y" component, where the "x" component may correspond to an amplitude value of the output vector 105, and the "y" component may be zero as the output vector 105 may be located along the x-axis.

The RSSI circuit 108 may comprise suitable circuitry and/or logic and may be adapted to acquire an output vector, such as a vector amplitude value, from the CORDIC circuit 106 and generate an RSSI feedback adjustment signal. The feedback adjustment signal generated by the RSSI 108 may then be utilized by an automatic gain control block, for example, which may be located in a subsequent signal processing module. The PLL loop filter 110 may comprise suitable circuitry and/or logic and may be adapted to filter an output angle value generated by CORDIC 106. For example, the PLL loop filter 110 may further process the output angle 118 to generate a filtered output that may be utilized during signal synchronization and/or demodulation.

In operation, control signal 112 may set the CORDIC 106 to operate in an arctangent mode, or as an amplitude/angle generator. Control signal 114 may be utilized to set the operating frequency to 12 CORDIC operation per microsecond, for example. The CORDIC 106 may acquire vector 103 as an input from equalizer circuits 102 and 103. The input angle 116 may be set to zero resulting in a zero offset in the vector output 105. The CORDIC 106 may then "push" input vector 103 down to the x-axis so the "y" output component yout of the output vector 105 may be close to zero. Accordingly, the "x" output component xOut of the output vector 105 may correspond to an amplitude value of the output vector 105. The xOut component of output vector 105 may be communicated to the RSSI circuit 108 which may be configured to generate an RSSI feedback adjustment signal. The feedback adjustment signal generated by the RSSI 108 may then be utilized by an automatic gain control block, for example, which may be located in a subsequent signal processing module. The output angle 118 may then be communicated to the PLL loop filter 110 for filtering and subsequent utilization during signal synchronization and demodulation.

Figure 2:
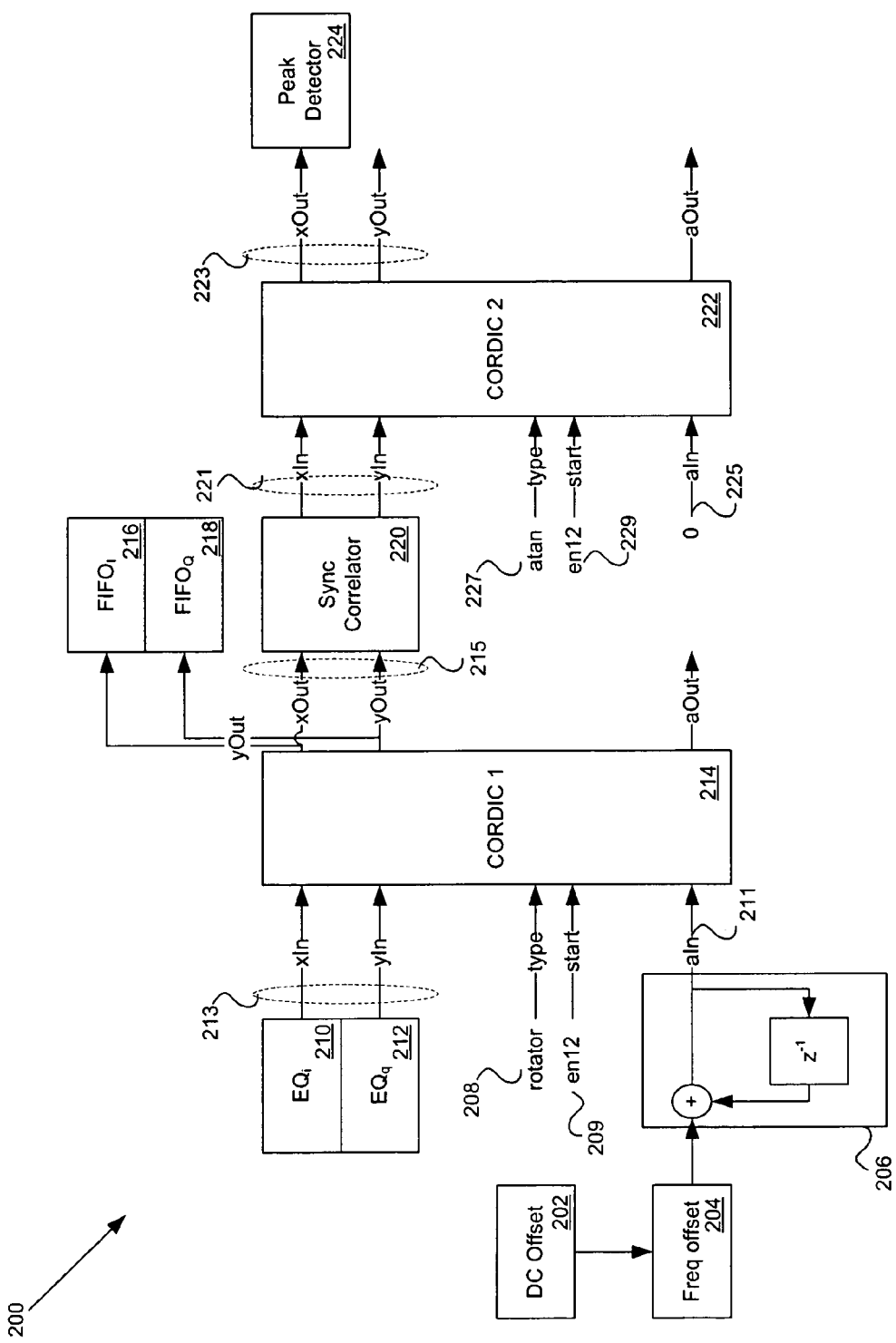
FIG. 2 is a block diagram of an exemplary circuit, which utilizes CORDIC processing during phase shift keying (PSK) synchronization, that may be utilized in connection with an aspect of the invention.

FIG. 2 is a block diagram of an exemplary circuit, which utilizes CORDIC processing during phase shift keying (PSK) synchronization, that may be utilized in connection with an aspect of the invention. Referring to FIG. 2, the signal processing circuit 200 may comprise equalization circuits 210 and 212, a DC offset circuit 202, a frequency offset circuit 204, an integrator circuit 206, CORDIC circuits 214 and 222, buffers 216 and 218, synchronization (sync) correlator 220, and a peak detector circuit 224.

The DC offset circuit 202 may comprise suitable circuitry and/or code and may be adapted to communicate a DC offset value to the frequency offset circuit 204. In an exemplary aspect of the invention, a DC offset value may be measured during synchronization of 1 mbps data rate signals, which may occur prior to synchronization of 2-3 mbps data rate signals. For example, a DC offset may be measured in a frequency shift keying (FSK) datapath and may be directly proportional to a frequency offset between a transmitter (Tx) and a receiver (Rx). With regard to an FSK receiver, baseband frequency may be converted to a signal level which may be sampled at appropriate time intervals to determine a transmitted bit. Frequency deviation may occur around a center frequency, the signal level may also vary around a central value, such as zero.

A systematic offset in the central value from the expected value may, therefore, be attributed to a systematic offset in the center frequency, or a frequency offset. In this manner, there may be a linear relationship between the DC offset and the frequency offset. Accordingly, a DC offset may be determined during FSK modulation, for example, and the determined DC offset may be utilized to estimate a frequency offset during phase shift keying (PSK) modulation. The frequency offset circuit 204 may comprise suitable circuitry and/or logic that may be adapted to generate a frequency offset based on the DC offset communicated from the DC offset circuit 202. The frequency offset may correspond to a frequency difference between the transmitted and received signals and may be compensated by a CORDIC in a rotation mode.

The equalizer circuits 210 and 212 may comprise suitable circuitry and/or logic and may be adapted to equalize an input signal, such as an RF signal, prior to PSK synchronization and/or demodulation of 2-3 mbps data rate signals and output a vector 213. The output vector 213 may comprise an "x" and a "y" component corresponding to an in-phase (I) and a quadrature (Q) component of equalizer circuits 210 and 212.

The CORDIC 214 may comprise suitable circuitry, logic and/or code and may be adapted to perform mathematical iterations on an input vector and/or an angle value during PSK synchronization of 2-3 mbps data rate signals. The CORDIC 214 may be utilized in a rotation mode to rotate a vector input according to an angle input. The CORDIC 214 may receive as inputs vector 213, control signals 208 and 209, and an input angle 211. Vector input 213 may be acquired from equalizer circuits 210 and 212. Control signal 208 may initialize the CORDIC 214 to operate in rotation mode. Control signal 209 may set the CORDIC 214 frequency to 12 operations per microsecond, or one CORDIC 214 operation per 12 MHz clock cycle, for example. The input angle 211 may correspond to a frequency offset value as determined by the frequency offset circuit 204 and the integrator circuit 206. The CORDIC 214 may be configured to rotate the input vector 213 in an opposite direction to a frequency offset as determined by the frequency offset block 204, so that the frequency offset may be compensated for in the output vector 215.

The integrator circuit 206 may comprise suitable circuitry and/or logic and may be adapted to provide an increasing offset to the frequency offset value generated by the frequency offset circuit 204. The integrator circuit 206 may be adapted to integrate the negation of the resulting frequency offset, generated by the frequency offset circuit 204. The negation may be integrated in an ongoing fashion to generate an offset that may be required by CORDIC 214 to counteract any Tx/Rx frequency offset. Accordingly, CORDIC 214 may utilize the negation generated by the integrator circuit 206 to rotate the input vector 213. The integrated frequency offset may be communicated to the CORDIC 214 as the angle input 211. The offset provided by the integrator circuit 206 may be in the opposite direction of the frequency offset provided by the frequency offset circuit 204 so that frequency offset between a transmitted and a received signal may be compensated.

The sync correlator circuit 220 may comprise suitable circuitry and/or logic and may be adapted to identify a PSK synchronization sequence/word in one or more frequency offset compensated vectors 215 generated as outputs by the CORDIC 214. The sync correlator circuit 220 may be adapted to receive from the CORDIC 214 one symbol per microsecond, for example, where each symbol may comprise 12 samples. The PSK synchronization sequence may comprise a plurality of symbols and, if matched by the input vectors, it may indicate a start of a demodulation sequence and/or a subsequent sampling point for demodulation. A PSK synchronization word may comprise 16 microseconds worth of symbols, for example, where each symbol may comprise 12 samples.

The CORDIC 222 may comprise suitable circuitry, logic and/or code and may be adapted to perform mathematical iterations on an input vector and/or an angle value during PSK synchronization of 2-3 mbps data rate signals. The CORDIC 222 may be utilized in an arctangent mode to generate an amplitude vector output 223 corresponding to the vector input 221 from the sync correlator 220. The CORDIC 222 may receive as inputs vector 221, control signals 227 and 229, and an input angle 225. Vector input 221 may be acquired from the sync correlator block 222. Control signal 227 may initialize the CORDIC 222 to operate in an arctangent mode and generate an amplitude output vector 223 corresponding to the input vector 221. Control signal 229 may set the CORDIC 222 frequency to 12 operations per microsecond, or one CORDIC 222 operation per 12 MHz clock cycle, for example. The input angle 225 may be set to zero. The x-axis component xOut of the output vector 223 may comprise the amplitude of each input vector 221. After the CORDIC 222 generates the output amplitude vector 223, the amplitude value xOut of the amplitude vector 223 may be communicated to the peak detector circuit 224.

The peak detector circuit 224 may comprise suitable circuitry and/or logic and may be adapted to receive one or more amplitude values xOut from the CORDIC 222 and determine a peak from the received amplitude values xOut. During the duration of one PSK synchronization word, which may be 16 microseconds, for example, the peak detector circuit 224 may determine one or more peaks from the received samples. Each peak may correspond to an optimal sampling point where sampling for demodulation may start in a subsequent operation. In addition, peaks may be determined by the peak detector circuit 224 at the rate of one peak for every microsecond worth of data, or one peak per 12 samples.

Buffers 216 and 218 may comprise first-in-first-out (FIFO) buffers, for example, and may be adapted to store the last microsecond worth of data, or 12 samples, that may be processed in the sync correlator 220. In a subsequent stage, after the peak detector 224 determines a peak within, for example, each microsecond worth of data, buffers 216 and 218 may be utilized to communicate the determined peak for further processing, such as a phase offset determination between a transmitted and a received signal, for example.

In operation, control signal 208 may be utilized to set the CORDIC 214 to operate in a rotating mode, or as an amplitude vector generator. Control signal 209 may set the operating frequency to 12 CORDIC operation per microsecond, for example. The CORDIC 214 may acquire vector 213 as an input from equalizer circuits 210 and 212. The DC offset circuit 202 may generate a DC offset value, which may be utilized by the frequency offset circuit 204 to generate a frequency offset value. The integrator 206 may continuously add incremental offset values to the generated frequency offset, thus, generating the input angle 211. The CORDIC 214 may rotate the input vector 213 according to the input angle 211 and may generate an output vector 215. The output vector 215 may then be communicated to the sync correlator block 220, as well as to buffers 216 and 218.

The sync correlator circuit 220 may then receive the frequency offset compensated output vector 215 and may search for a PSK synchronization sequence/word through the output vectors 215. The output vector of the sync correlator 220 may be communicated to the CORDIC 222. The CORDIC 222 may be utilized in an arctangent mode to generate an amplitude vector output 223 corresponding to the vector input 221 from the sync correlator 220. After the CORDIC 222 generates the output amplitude vector 223, the amplitude value xOut of output vector 223 may be communicated to the peak detector circuit 224 for processing. The peak detector circuit 224 may receive one or more amplitude values xOut in output vector 223 and determine an optimal sampling point based on a peak from the received amplitude values. Each determined peak may indicate where sampling for demodulation may start in a subsequent operation. In addition, peaks may be determined by the peak detector circuit 224 at the rate of one peak for every microsecond worth of data, or one peak per 12 samples.

Figure 3:
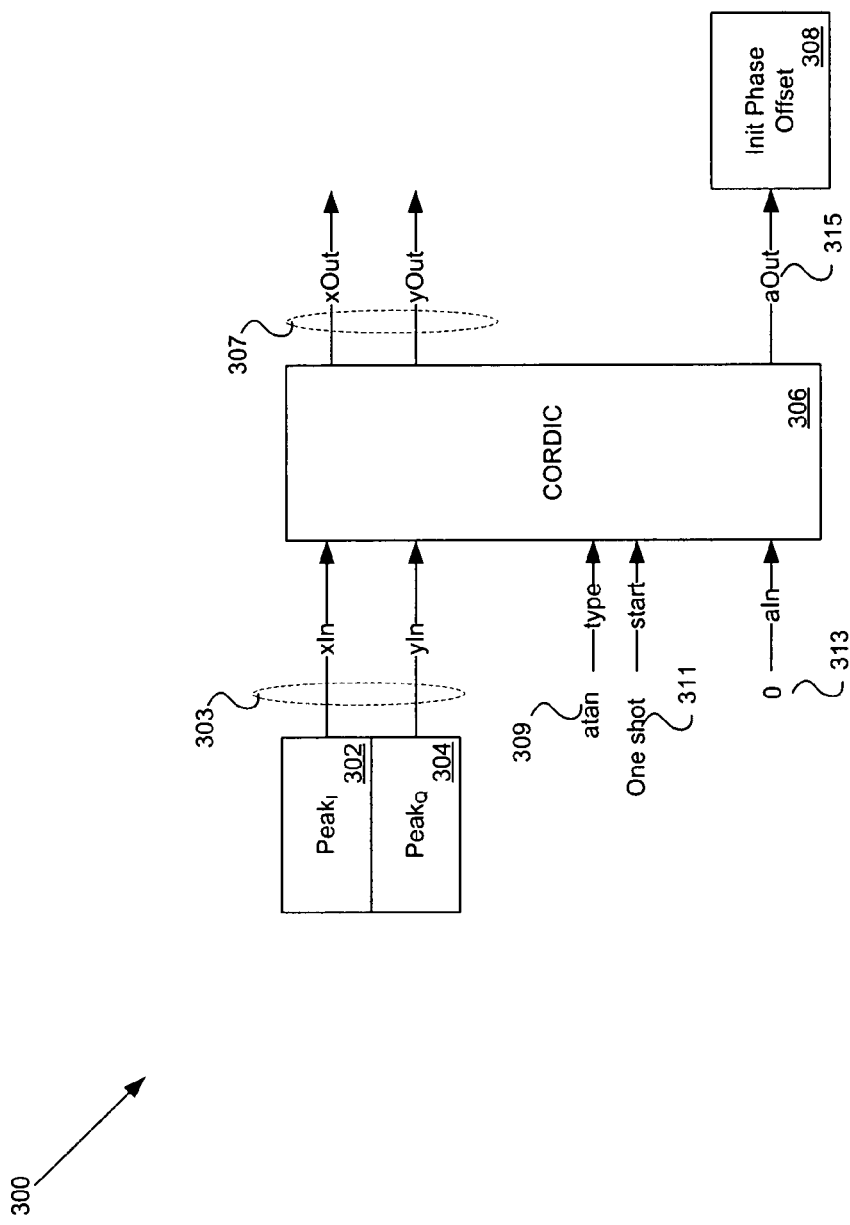
FIG. 3 is a block diagram of an exemplary circuit utilizing CORDIC processing for initial phase offset calculation for PSK demodulation, that may be utilized in connection with an aspect of the invention.

FIG. 3 is a block diagram of an exemplary circuit utilizing the CORDIC processing for initial phase offset calculation for PSK demodulation, that may be utilized in connection with an aspect of the invention. Referring to FIG. 3, the signal processing circuit 300 may comprise buffers 302 and 304, CORDIC circuit 306, and an initial phase offset generator 308.

The buffers 302 and 304 may be adapted to store memory locations that may correspond to one or more optimal sampling point, or peaks, as determined by a peak detector circuit. For example, buffers 302 and 304 may store memory locations within the buffers 216 and 218 in FIG. 2 that correspond to one or more optimal sampling point vectors as determined by the peak detector circuit 224. The optimal sampling point vector 303 from a memory location stored in buffers 302 and 304, may correspond to an I and Q signal components, respectively, and may be communicated to CORDIC 306 for further processing.

The CORDIC 306 may comprise suitable circuitry, logic and/or code and may be adapted to perform mathematical iterations on an input vector and/or an angle value during PSK demodulation of 2-3 mbps data rate signals. In this regard, the CORDIC 306 may be utilized in an arctangent mode to generate an amplitude vector output 307 corresponding to the optimal sampling point vector input 303 from the buffers 302 and 304. The CORDIC 306 may receive as inputs vector 303, control signals 309 and 311, and an input angle 313. The control signal 309 may initialize the CORDIC 306 to operate in an arctangent mode and generate an output vector 307 and an output angle 315, corresponding to the input vector 303. The control signal 311 may be utilized to set the CORDIC 306 frequency to a single operation, or a "single shot," so that a single phase offset, corresponding to the optimal sampling point in buffers 302 and 304, may be determined. The input angle 225 may be set to zero. After the CORDIC 306 generates the output angle 315 corresponding to the optimal sampling point vector 303, the output angle 315 may be communicated to the initial phase offset generator 308.

The initial phase offset generator 308 may comprise suitable circuitry and/or logic and may be adapted to generate an initial phase offset value corresponding to phase differences in received and transmitted signals. The phase offset determined by the initial phase offset generator 308 may be utilized to rotate an input vector, for example, and compensate for the difference in phases between a transmitted and a received signal during PSK demodulation of signals with 2-3 mbps data rate.

In operation, the control signal 309 may configure the CORDIC 306 to operate in an arctangent mode, or as an amplitude/angle generator. Control signal 311 may set the CORDIC 306 frequency to a single operation, or a "single shot," so that a single phase offset corresponding to the optimal sampling point in buffers 302 and 304 may be determined. The input angle 313 may be set to zero. After the CORDIC 306 generates the output angle 315 corresponding to the optimal sampling point vector 303, the output angle 315 may be communicated to the initial phase offset generator 308. The initial phase offset generator 308 may generate an initial phase offset value corresponding to phase differences in received and transmitted signals.

Figure 4:
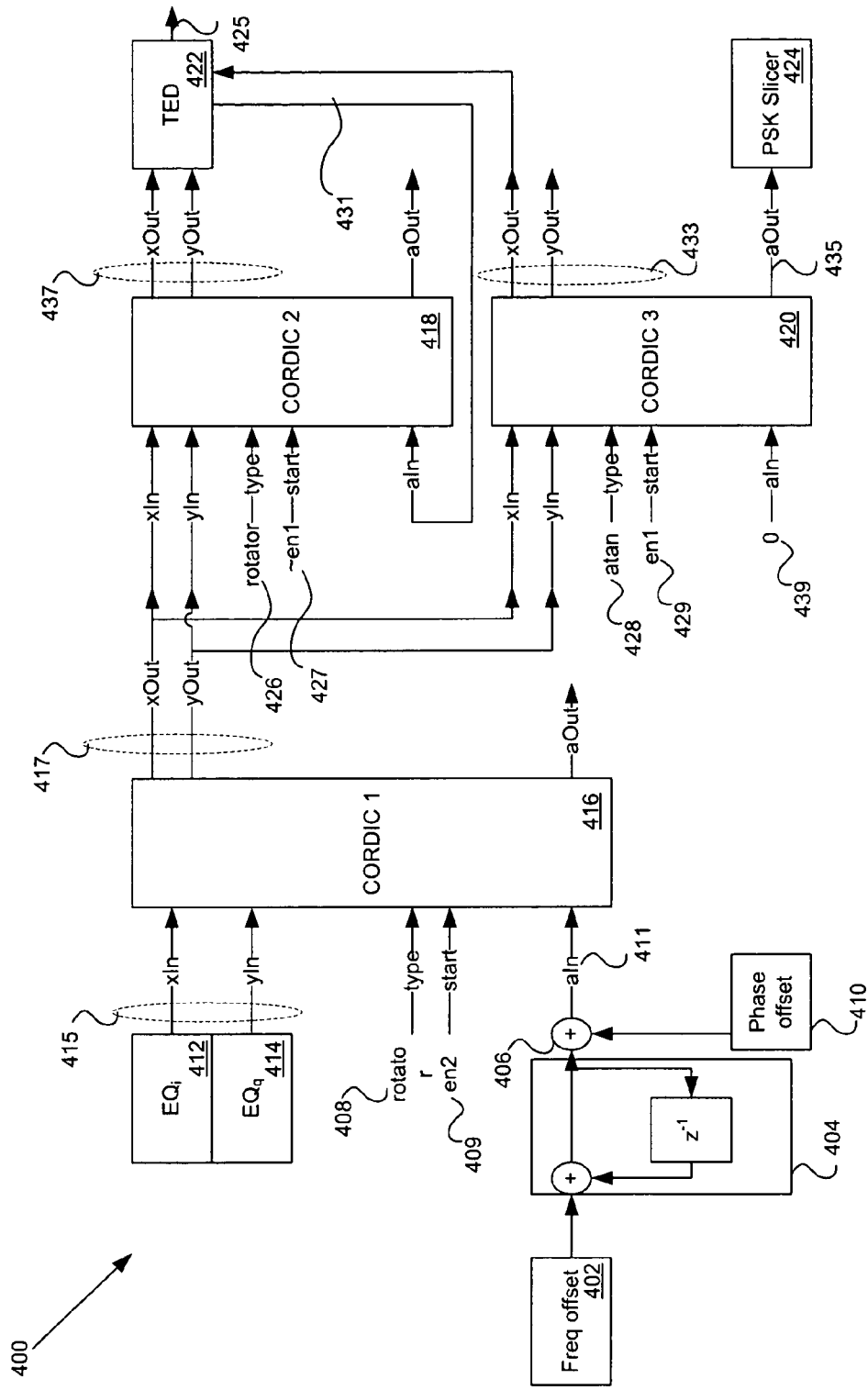
FIG. 4 is a block diagram of an exemplary circuit utilizing CORDIC processing during PSK demodulation, that may be utilized in connection with an aspect of the invention.

FIG. 4 is a block diagram of an exemplary circuit utilizing CORDIC processing during PSK demodulation, that may be utilized in connection with an aspect of the invention. Referring to FIG. 4, the signal processing circuit 400 may comprise equalizer circuits 412 and 414, a frequency offset circuit 402, an integrator circuit 404, a phase offset circuit 410, an adder 406, CORDIC circuits 416, 418, and 420, a timing error detection (TED) circuit 422, and a PSK slicer 424.

The equalizer circuits 412 and 414 may comprise suitable circuitry and/or logic and may be adapted to equalize an input signal, such as an RF signal, prior to PSK synchronization and/or demodulation of 2-3 mbps data rate signals and output a vector 415. The output vector 415 may comprise an "x" and a "y" component corresponding to an in-phase (I) and a quadrature (Q) component of equalizer circuits 412 and 414.

The frequency offset circuit 402 may comprise suitable circuitry and/or logic and may be adapted to generate a frequency offset based on a DC offset communicated from a DC offset circuit, for example. The frequency offset may correspond to a frequency difference between a transmitted and a received signal, for example, and may be compensated by a CORDIC operating in a rotation mode. A DC offset may be measured in a frequency shift keying (FSK) datapath and may be directly proportional to a frequency offset between a transmitter (Tx) and a receiver (Rx). With regard to an FSK receiver, baseband frequency may be converted to a signal level which may be sampled at appropriate time intervals to determine a transmitted bit. Frequency deviation may occur around a center frequency, the signal level may also vary around a central value, such as zero. A systematic offset in the central value from the expected value may, therefore, be attributed to a systematic offset in the center frequency, or a frequency offset. In this manner, there may be a linear relationship between the DC offset and the frequency offset. Accordingly, a DC offset may be determined during FSK modulation, for example, and the determined DC offset may be utilized to estimate a frequency offset during phase shift keying (PSK) modulation.

The integrator circuit 404 may comprise suitable circuitry and/or logic and may be adapted to provide an increasing offset to the frequency offset value generated by the frequency offset circuit 402. The integrator circuit 404 may be adapted to integrate the negation of the resulting frequency offset, generated by the frequency offset circuit 402. The negation may be integrated in an ongoing fashion to generate an offset that may be required by CORDIC 416 to counteract any Tx/Rx frequency offset. Accordingly, CORDIC 416 may utilize the negation generated by the integrator circuit 404 to rotate the input vector 415. The integrated frequency offset may then be communicated to adder 406 and, after adding a phase offset, to the CORDIC 416 as the angle input 411. The offset provided by the integrator circuit 404 may be in the opposite direction of the frequency offset provided by the frequency offset circuit 402 so that frequency offset between a transmitted and a received signal may be compensated.

The phase offset circuit 410 may comprise suitable circuitry and/or logic and may be adapted to generate an initial phase offset value corresponding to phase differences in a received and a transmitted signal. The phase offset determined by the phase offset circuit 410 may be utilized by the CORDIC 416 to rotate an input vector 415, for example, and compensate for the difference in phases between a transmitted and a received signal during PSK demodulation of signals with 2-3 mbps data rate. The adder 406 may then add the phase offset generated by the phase offset circuit 410 with the frequency offset generated by the frequency offset circuit 402 to generate an input angle 411. The input angle 411 may be utilized by the CORDIC 416 to rotate the input vector 415 and compensate for frequency and phase differences.

The CORDIC 416 may comprise suitable circuitry, logic and/or code and may be adapted to perform mathematical iterations on an input vector and/or an angle value during PSK demodulation of 2-3 mbps data rate signals. The CORDIC 416 may be utilized in a rotation mode to rotate a vector input according to an angle input. The CORDIC 416 may receive as inputs vector 415 from the equalizer blocks 412 and 414, control signals 408 and 409, and an input angle 411. The vector input 415 may be acquired from equalizer circuits 412 and 414. The control signal 408 may initialize the CORDIC 416 to operate in rotation mode and control signal 409 may set the CORDIC 416 frequency to two operations per microsecond, for example. The two operation of the CORDIC 416 may generate output vectors 417 which may be utilized by the CORDIC circuits 418 and 420.

A CORDIC 416 operation may be related to a peak value, as previously determined with regard to FIG. 2, and another CORDIC 416 operation may be relate to an off-peak value that may be necessary for timing error detection (TED), for example. A peak vector output 417 may be communicated to the CORDIC 420 and an off-peak vector output 417 may be communicated to the CORDIC 418 for further processing. The input angle 411 may correspond to a frequency and a phase offset value as determined by the frequency offset circuit 402, the integrator circuit 404, and the phase offset circuit 410. The CORDIC 416 may rotate the input vector 415 in an opposite direction to a frequency offset and a phase offset as determined by the frequency offset circuit 402 and the phase offset circuit 410, so that frequency and phase offsets may be compensated for in the output vector 417.

The CORDIC circuits 418 and 420 may be adapted to operating at the same time each utilizing one vector output per microsecond, corresponding to the two operations per microsecond performed by the CORDIC 416. The CORDIC 420 may comprise suitable circuitry, logic and/or code and may be adapted to perform mathematical iterations on an input vector and/or angle value utilizing arctangent look-up tables, for example, during PSK demodulation of signals with 2-3 mbps data rates. The CORDIC 420 may be utilized in an arctangent mode to transform an input vector 417 into an amplitude and/or an angle. Accordingly, the CORDIC 420 may receive as inputs the peak vector output 417 of the CORDIC 416, control signals 428 and 429, and an input angle 439. The peak vector input 417 may be acquired from the output of CORDIC 416. The control signal 428 may initialize the CORDIC 420 to operate in an arctangent mode. The control signal 429 may set the CORDIC 420 frequency to one operation per microsecond, for example, corresponding to one off-peak output vector per microsecond generated by the CORDIC 416.

The input angle 439 may correspond to an angle offset, such as a zero angle offset, for the output vector 433, and the output angle 435 may correspond to the angle of the output vector 433. In addition, output angle 435 may be biased in a positive or a negative direction by setting the input angle 439 to a value other than zero. The output vector 433 may comprise an "x" and a "y" component, where the "x" component xOut may correspond to an amplitude value of the output vector 433, and the "y" component yOut may be zero as the output vector 433 may be a vector along the x-axis. The output angle 435 may be communicated to the PSK slicer 424 for slicing or bit generation. The xOut amplitude component of the output vector 433 may be communicated to the timing error detection circuit (TED) 422 for frequency and phase offset correction of a peak output vector 437 from CORDIC 418.

The PSK slicer 424 may comprise suitable circuitry and/or logic and may be adapted to acquire the angle output 435 corresponding to a peak vector input to the CORDIC 420, and generate one or more bits for collection into packets. Each angle received from the CORDIC 420 may correspond to two or three bits depending on the type of PSK demodulation that is used by the circuit 400. For example, if quaternary phase shift keying (QPSK) is utilized by the PSK slicer 424, two bits per angle may be generated and if 8-level phase shift keying (8PSK) is utilized, three bits per angle may be generated. Bits generated by the PSK slicer 424 may be subsequently processed and collected into packets.

The CORDIC 418 may comprise suitable circuitry, logic and/or code and may be adapted to perform mathematical iterations on an input vector and/or an angle value during PSK demodulation of 2-3 mbps data rate signals. The CORDIC 418 may be utilized in a rotation mode to rotate a peak vector input 417 according to an angle input to achieve frequency and phase offset correction. The CORDIC 418 may receive as inputs a peak vector 417 from the output of the CORDIC 416, control signals 426 and 427, and an input angle 431. The control signal 426 may initialize the CORDIC 418 to operate in rotation mode and control signal 427 may set the CORDIC 418 frequency to one operation per microsecond, for example, corresponding to one peak output vector per microsecond generated by the CORDIC 416. The input angle 431 may correspond to a frequency and/or a phase offset value and may be communicated as a feedback signal generated by the TED 422. The CORDIC 418 may be adapted to rotate the input off-peak vector 417 according to the input angle 431 received from the TED 422. In this manner, the input off-peak vector 417 may be rotated according to a frequency and/or phase offset to achieve fine sampling point adjustment.

The timing error detection (TED) circuit 422 may comprise suitable circuitry and/or logic and may be adapted to acquire the rotated output vector 437 from the CORDIC 418, and the amplitude value xOut of the output vector 433 from the CORDIC 420 and generate an angle feedback signal 431 and an output signal 425. Since peak sampling points during PSK synchronization and demodulation may change over time, the TED 422 may be utilized to track the optimal sampling point and adjust any deviations and/or time-related drifts to ensure that optimal sampling point may be obtained. Output 425 from the TED 422 may be utilized for fine adjustment of the optimal sampling point.

In operation, control signal 408 may set the CORDIC 416 to operate in a rotating mode and control signal 409 may set the operating frequency to, for example, two CORDIC operations per microsecond, for example. The two CORDIC 416 operations may generate output vectors 417 which may be utilized by the CORDIC circuits 418 and 420. One CORDIC 416 operation may be related to a peak value, as previously determined with regard to FIG. 2, another CORDIC 416 operation may be related to an off-peak value that may be necessary for timing error detection (TED), for example. The input angle 411 may correspond to a frequency and a phase offset value as determined by the frequency offset circuit 402, the integrator circuit 404 and the phase offset circuit 410. The CORDIC 416 may rotate the input vector 415 in an opposite direction to a frequency offset and a phase offset as determined by the frequency offset circuit 402 and the phase offset circuit 410, so that frequency and phase offsets may be compensated for in the output vector 417. After the CORDIC 416 rotates the input vector 415 according to the input angle 411, two output vectors 417 may be generated per microsecond, a peak and an off-peak vector output. The peak vector output 417 may be communicated to the CORDIC 420 and the off-peak vector output 417 may be communicated to the CORDIC 418 for further processing.

The CORDIC 420 may utilize the peak vector output 417 from the CORDIC 416 and generate an output angle 435 and an amplitude value xOut in an output vector 433. The output angle 435 may be utilized by the PSK slicer 424 to generate bits for packets. The CORDIC 418 may utilize the off-peak vector output 417 from the CORDIC 416 and generate an output vector 437 by rotating the vector 417 according to the angle feedback signal 431. The output vector 437 and the amplitude value xOut from the output vector 433 may be utilized by the TED 422 to generate an angle feedback signal 431 and an output signal 425.

In an exemplary aspect of the invention, the signal processing functionalities of the CORDIC circuits utilized in FIGS. 1-4 may be implemented utilizing a dual-CORDIC architecture. In this manner, two CORDIC circuits may each be adapted to function in arctangent and/or rotation modes and operate at process a different number of CORDIC start operations per microsecond. Although a dual-CORDIC system is described herein, the present invention may not be so limited. Other architectures with a different number of CORDIC circuits may also be implemented so that signal processing tasks as described in FIGS. 1-4 may be performed with a reduced number of CORDIC circuits.

Figure 5:
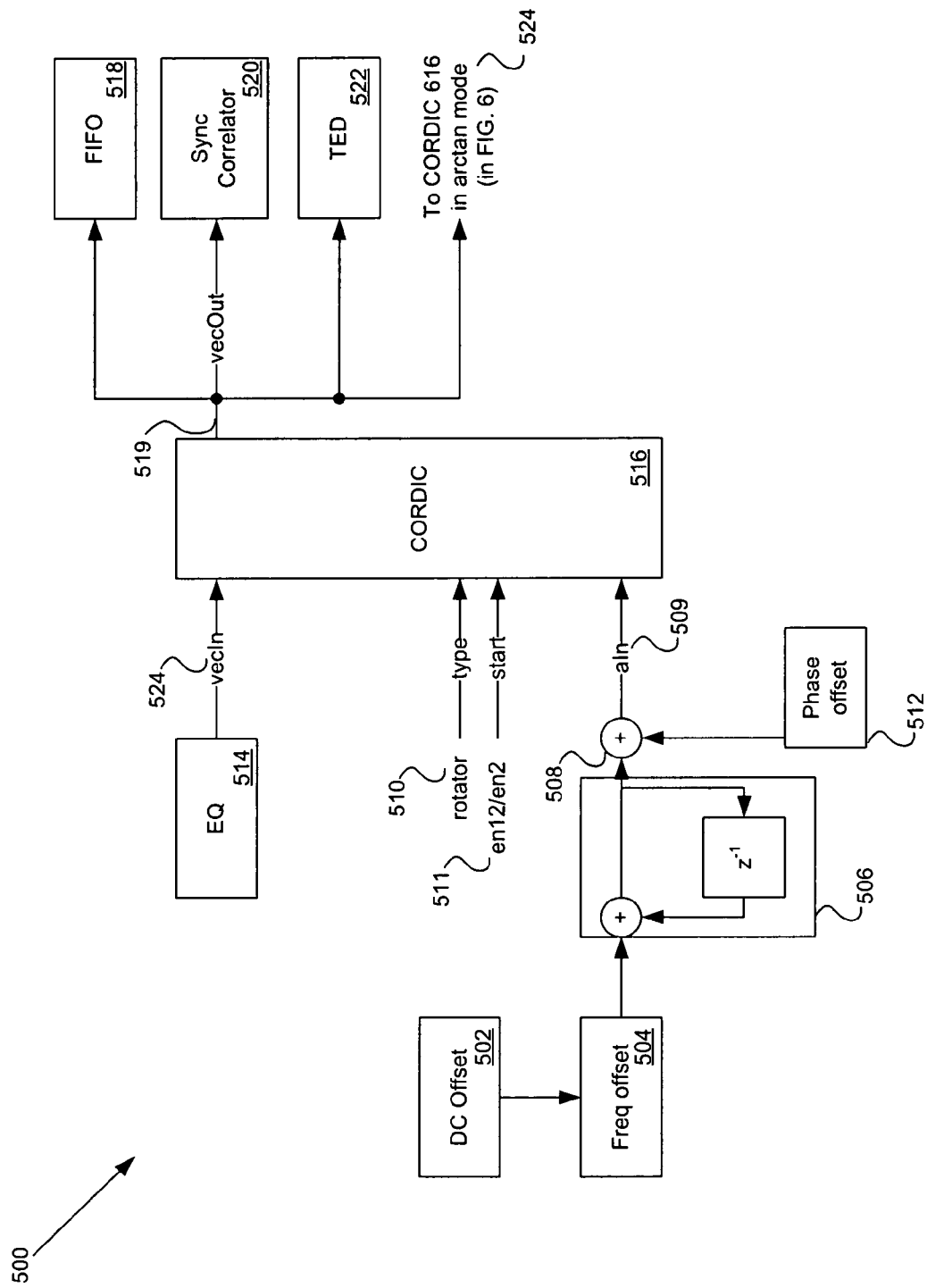
FIG. 5 is a block diagram of an exemplary circuit utilizing vector rotating CORDIC in a dual-CORDIC implementation scheme, in accordance with an embodiment of the invention.

FIG. 5 is a block diagram of an exemplary circuit utilizing vector rotating CORDIC in a dual-CORDIC implementation scheme, in accordance with an embodiment of the invention. Referring to FIG. 5, the signal processing circuit 500 may comprise an equalization block 514, a DC offset block 502, a frequency offset block 504, an integrator 506, an adder 508, a phase offset block 512, CORDIC circuit 516, buffer 518, synchronization (sync) correlator 520, and a timing error detection (TED) circuit 522.

The DC offset circuit 502 may comprise suitable circuitry and/or code and may be adapted to communicate a DC offset value to the frequency offset circuit 504. In an exemplary aspect of the invention, a DC offset value may be measured during synchronization of 1 mbps data rate signals, which may occur prior to synchronization of 2-3 mbps data rate signals. A DC offset may be measured in a frequency shift keying (FSK) datapath and may be directly proportional to a frequency offset between a transmitter (Tx) and a receiver (Rx). With regard to an FSK receiver, baseband frequency may be converted to a signal level which may be sampled at appropriate time intervals to determine a transmitted bit. Frequency deviation may occur around a center frequency, the signal level may also vary around a central value, such as zero.

A systematic offset in the central value from the expected value may, therefore, be attributed to a systematic offset in the center frequency, or a frequency offset. In this manner, there may be a linear relationship between the DC offset and the frequency offset. Accordingly, a DC offset may be determined during FSK modulation, for example, and the determined DC offset may be utilized to estimate a frequency offset during phase shift keying (PSK) modulation. The frequency offset circuit 504 may comprise suitable circuitry and/or logic and may be adapted to generate a frequency offset based on the DC offset communicated from the DC offset circuit 502. The frequency offset may correspond to a frequency difference between the transmitted and received signals and may be compensated by a CORDIC in a rotation mode.

The equalizer circuit 514 may comprise suitable circuitry and/or logic and may be adapted to equalize an input signal, such as an RF signal, prior to PSK synchronization and/or demodulation of 2-3 mbps data rate signals and output a vector 524. The output vector 524 may comprise an "x" and a "y" component corresponding to an in-phase (I) and a quadrature (Q) component of equalizer circuit 514.

The integrator circuit 506 may comprise suitable circuitry and/or logic and may be adapted to provide an increasing offset to the frequency offset value generated by the frequency offset circuit 504. The integrator circuit 506 may be adapted to integrate the negation of the resulting frequency offset, generated by the frequency offset circuit 504. The negation may be integrated in an ongoing fashion to generate an offset that may be required by CORDIC 516 to counteract any Tx/Rx frequency offset. Accordingly, CORDIC 516 may utilize the negation generated by the integrator circuit 506 to rotate the input vector 524. The integrated frequency offset may then be communicated to adder 508 and, after adding a phase offset, to CORDIC 516 as the angle input 509. The offset provided by the integrator circuit 506 may be in the opposite direction of the frequency offset provided by the frequency offset circuit 504 so that frequency offset between a transmitted and a received signal may be compensated.

The phase offset circuit 512 may comprise suitable circuitry and/or logic and may be adapted to generate an initial phase offset value corresponding to phase differences in received and transmitted signals. The phase offset determined by the phase offset circuit 512 may be utilized by the CORDIC 516 to rotate an input vector 524, for example, and compensate for the difference in phases between a transmitted and a received signal during PSK demodulation of signals with 2-3 mbps data rate. The adder 508 may then add the phase offset generated by the phase offset circuit 512 with the frequency offset generated by the frequency offset circuit 504 to generate an input angle 509. The input angle 509 may be utilized by the CORDIC 516 to rotate the input vector 524 and compensate for frequency and phase differences.

The CORDIC 516 may comprise suitable circuitry, logic and/or code and may be adapted to perform mathematical iterations on an input vector and/or an angle value during PSK synchronization of 2-3 mbps data rate signals. In an exemplary aspect of the invention, the CORDIC 516 may be utilized in a rotation mode to rotate a vector input according to an angle input and generate a vector output that may be utilized for a plurality of PSK synchronization and/or demodulation signal processing tasks. The CORDIC 516 may receive as inputs vector 524, control signals 510 and 511, and an input angle 509. Vector input 524 may be acquired from equalizer circuit 514. The control signal 510 may initialize the CORDIC 516 to operate in a rotation mode. The control signal 511 may set the CORDIC 516 frequency to a fixed number of operations per microsecond, depending on the use of the CORDIC 516 output vector 519.

For example, if the rotated output vector 519 is utilized by the TED circuit 522, the CORDIC 516 may operate at a frequency of two CORDIC operations per microsecond, for example. If the rotated output vector 519 is utilized by the sync correlator 520 or the buffer 518 with regard to peak detection, the CORDIC 516 may operate at a frequency of 12 CORDIC operations per microsecond, for example. The input angle 509 may correspond to a frequency offset value as determined by the frequency offset circuit 504 and the integrator circuit 506. The CORDIC 516 may rotate the input vector 524 in an opposite direction to a frequency offset as determined by the frequency offset block 504, so that the frequency offset may be compensated for in the output vector 519. The CORDIC 516 output vector 519 may be subsequently utilized by the buffer 518, which may store peak vector memory locations, by the sync correlator 520, and/or for timing error detection by the TED 522, for example.

In operation, the control signal 510 may set the CORDIC 516 to operate in a rotating mode and control signal 511 may set the operating frequency to two or twelve CORDIC operation per microsecond, for example. The rotated vector output 519 may then be utilized within the signal processing circuit 500 for one or more signal processing stages of PSK synchronization and/or demodulation. The buffer 518 may correspond in function to buffers 216 and 218 in FIG. 2, and may be adapted to store one microsecond worth of data from the vector output 519 of the CORDIC 516 for peak determination. The sync correlator 520 may correspond in function to the sync correlator 220 in FIG. 2 and may be utilized for peak detection. The TED 522 may correspond in function to the TED 422 in FIG. 4 and may be utilized for fine adjustment of a sampling point, for example. The CORDIC 516 may communicate for further processing the output vector 519 via signal 524 to a second CORDIC, within a dual-CORDIC architecture, such as the CORDIC 616 in FIG. 6.

Figure 6:
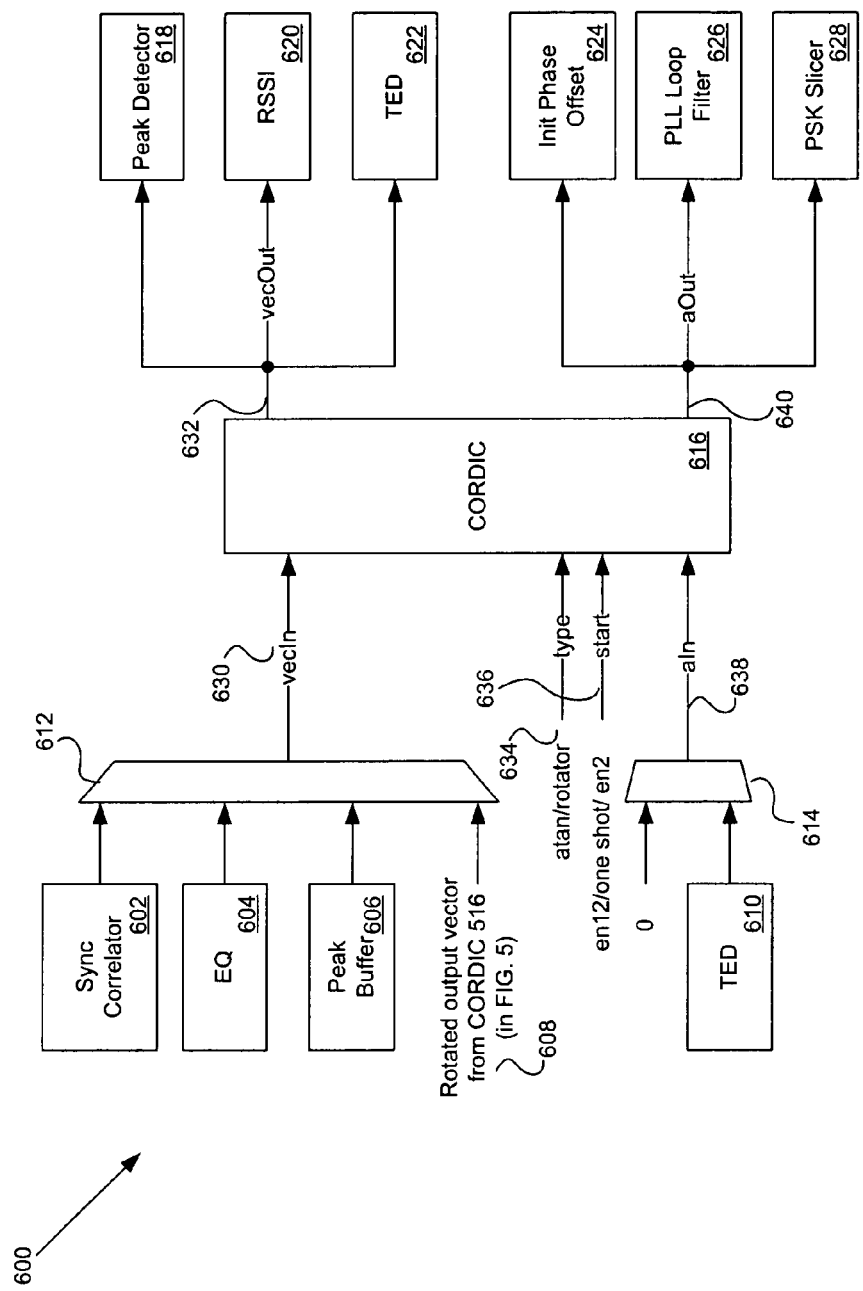
FIG. 6 is a block diagram of an exemplary circuit utilizing a dual mode CORDIC in a dual-CORDIC implementation scheme, in accordance with an embodiment of the invention.

FIG. 6 is a block diagram of an exemplary circuit 600 utilizing a dual mode CORDIC in a dual-CORDIC implementation scheme, in accordance with an embodiment of the invention. The signal processing circuit 600 may comprise a synchronization (sync) correlator circuit 602, an equalizer circuit 604, a peak buffer 606, TED circuits 610 and 622, multiplexers 612 and 614, a CORDIC circuit 616, a peak detector circuit 618, an RSSI circuit 620, an initial phase offset circuit 624, a PLL loop filter 626, and a PSK slicer 628.

The CORDIC 616 may comprise suitable circuitry, logic and/or code and may be adapted to perform mathematical iterations on an input vector and/or an angle value during 1 mbps data rate signal synchronization and demodulation and/or PSK synchronization and/or demodulation of 2-3 mbps data rate signals. In an exemplary aspect of the invention, the CORDIC 616 may be utilized in a rotation mode to rotate a vector input 630 to the CORDIC 616 according to an angle input 638 and generate a vector output 632 that may be utilized for timing error detection by the TED 622, for example. The CORDIC 616 may also be utilized in an arctangent mode to generate an amplitude output vector 632 and a corresponding output angle 640. The amplitude output vector 632 may be utilized for peak detection by the peak detector circuit 618, and/or for a gain control feedback by the RSSI circuit 620, for example. The output angle 640 may be utilized for initial phase offset determination by the initial phase offset circuit 624, for PLL loop filtering of the output angle 640 by the PLL loop filter 626, and/or for bit generation by the PSK slicer 628, for example.

In operation, the CORDIC 616 may receive as inputs vector 630, control signals 634 and 636, and an input angle 638. The input vector 630 may be selected by the multiplexer 612 from a plurality of vector inputs depending on how the CORDIC 616 vector output 632 and angle output 640 will be utilized. For example, if vector output 632 is utilized for peak detection by the peak detector 618, multiplexer 612 may select as input vector 630 an output vector of the sync correlator 602 and a control signal 634 may be utilized to initialize the CORDIC 616 to operate in an arctangent mode. If vector output 632 is utilized for gain control feedback generation by the RSSI circuit 620, multiplexer 612 may select as input vector 630 an output vector of the equalizer circuit 604 and a control signal 634 may initialize the CORDIC 616 to operate in an arctangent mode.

If vector output 632 is utilized for timing error detection by the TED 622, the multiplexer 612 may select as input vector 630, an output vector signal 608, which may be acquired from CORDIC circuit 516 in FIG. 5, and also control signal 634 may initialize the CORDIC 616 to operate in a rotation mode. An output of the TED 622 may be communicated to the TED 610 as an angle feedback signal, similar to the angle feedback signal 431 in FIG. 4. If angle output 640 is utilized for initial phase offset determination by the initial phase offset circuit 624, the multiplexer 612 may select as input vector 630, a peak vector output stored in peak buffer 606, similar to the use of peak buffers 302 and 304 in FIG. 3. The control signal 634 may initialize CORDIC 616 to operate in an arctangent mode.

If angle output 640 is utilized for filtering by the PLL loop filter 626, multiplexer 612 may select as input vector 630 an output vector of the equalizer circuit 604, and the control signal 634 may initialize the CORDIC 616 to operate in an arctangent mode. If the angle output 640 is utilized for bit generation by the PSK slicer 628, the multiplexer 612 may select as input vector 630, an output vector signal 608, which may be acquired from CORDIC circuit 516 in FIG. 5. The control signal 634 may initialize the CORDIC 616 to operate in an arctangent mode. In addition, if the CORDIC 616 is utilized in an arctangent mode, the multiplexer 614 may be adapted to select zero as the input angle 638. If the CORDIC 616 is utilized in a rotation mode, the multiplexer 614 may be adapted to select an angle input from the TED 610, which may comprise an angle feedback signal received from the TED 622.

The peak detector 618, RSSI circuit 620, TED 622, Initial phase offset circuit 624, PLL loop filter 626, and PSK slicer 628 may correspond to the peak detector 224, RSSI circuit 108, TED 422, initial phase offset circuit 308, PLL loop filter 110, and PSK slicer 424 in FIG. 2, FIG. 1, FIG. 4, FIG. 3, FIG. 1, and FIG. 4, respectively.

In another aspect of the invention the CORDIC 516 may be implemented as a single input CORDIC within a dual-CORDIC architecture for signal processing. For example, referring to FIGS. 5 and 6, the outputs of the CORDIC 516 may be selected as inputs to the CORDIC 616. A plurality of signal processing tasks may be implemented utilizing the outputs of the CORDIC 616. In this regard, the CORDIC 616 may be implemented as a single output CORDIC within the dual-CORDIC architecture comprising the CORDICs 516 and 616 and implemented as illustrated in FIGS. 5 and 6.

Figure 7:
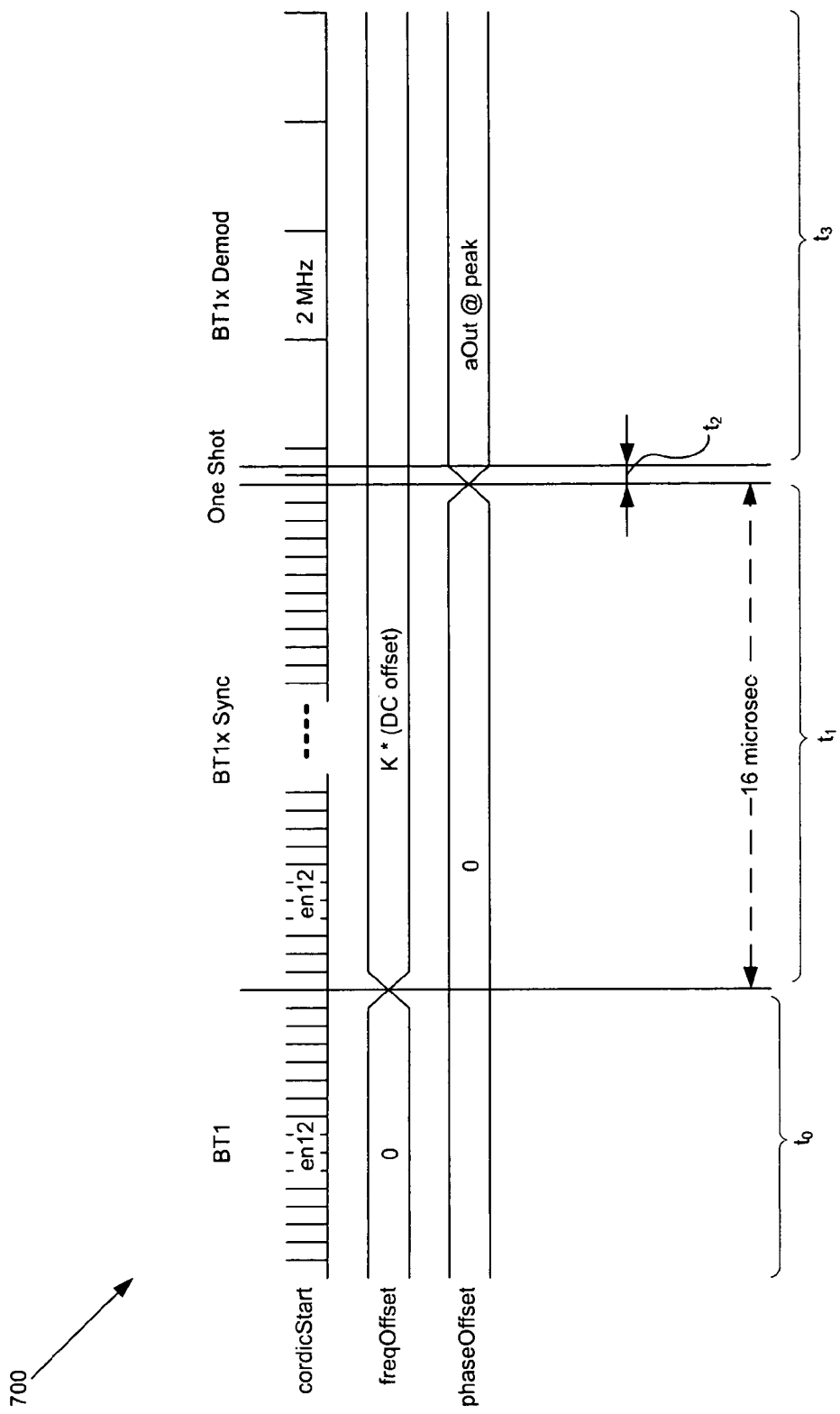
FIG. 7 is an exemplary timing diagram of CORDIC operations in a dual-CORDIC implementation scheme, in accordance with an embodiment of the invention.

FIG. 7 is an exemplary timing diagram 700 of CORDIC operations in a dual-CORDIC implementation scheme, in accordance with an embodiment of the invention. The exemplary dual-CORDIC implementation scheme may comprise CORDIC circuits 516 and 616 in FIGS. 5 and 6, respectively. Referring to FIGS. 5, 6, and 7, during time period to, synchronization and demodulation of one mbps data rate signals may take place. A CORDIC circuit in a dual-CORDIC architecture, such as the CORDIC 516 in FIG. 5, may be utilized to process 12 symbols per microsecond, for example. During time to, phase and frequency offsets may not be calculated. Phase and frequency offsets may be calculated subsequently, during PSK synchronization and/or demodulation, for example.

During time period $t_1$, the CORDIC circuits 516 and 616 may be utilized during PSK synchronization as described with regard to FIGS. 5 and 6. Both CORDIC circuits 516 and 616 may run at 12 new CORDIC start operation per microsecond for the duration of one PSK sync word, or 16 microseconds. Both of the CORDIC circuits 516 and 616 may run simultaneously at 12 operations per CORDIC per microsecond for a period of one PSK sync word, or 16 microseconds. The total number of CORDIC operations for one PSK sync word may, therefore, be (2*12*16), or 384. The frequency offset freqoffset may be linearly related to the DC offset. The frequency offset, therefore, may be represented as K*(DC offset), where K may be a constant value.

During time period $t_2$, the CORDIC circuit 616 may be utilized during PSK initial phase offset calculation, or "one shot" calculation, for PSK demodulation. During phase offset calculation in time period $t_2$, a delay may be inserted in the continuous signal datapath being received by the two CORDIC circuits in the dual-CORDIC architecture, so that the initial phase offset may be calculated. During time period $t_3$, the CORDIC circuits 516 and 616 may be adapted to generate 2 CORDIC start operations per microsecond, for example, and may be utilized during PSK demodulation as described with regard to FIGS. 5 and 6. The frequency offset generated in time period $t_1$ and the phase offset generated in time period $t_2$ may be utilized during PSK demodulation in time period $t_3$.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing an RF signal, the method comprising:
   utilizing a dual Coordinate Rotation Digital Computer (CORDIC) architecture circuit for phase and frequency synchronization and demodulation of a received signal, said dual CORDIC architecture circuit comprising a single input CORDIC and a single output CORDIC, wherein said received signal comprises a plurality of bit rates, and wherein said synchronization is based on a frequency difference between said received signal and a transmitted signal corresponding to said received signal;
   generating, by said single output CORDIC utilizing an output of said single input CORDIC, an amplitude output; and
   generating a received signal strength indicator(RSSI) signal utilizing said amplitude output of said single output CORDIC, said single output CORDIC being configured in one or both of a rotating mode and/or an arctangent (ARCTAN) mode.

2. The method according to claim 1, wherein said received signal comprises a one megabit per second (Mbps) signal.

3. The method according to claim 1, comprising configuring said single input CORDIC to operate in a rotating mode.

4. The method according to claim 1, comprising configuring said single output CORDIC to operate in one or both of said rotating mode and/or said arctangent (ARCTAN) mode.

5. The method according to claim 1, comprising correlating a rotated output of said single input CORDIC with a phase shift keying (PSK) synchronization (sync) word.

6. The method according to claim 5, comprising buffering at least a portion of said correlated rotated output of said single input CORDIC.

7. The method according to claim 6, comprising determining at least one signal peak utilizing an amplitude output signal of said single output CORDIC, wherein said amplitude output signal corresponds to at least a portion of said correlated rotated output and a portion of said buffered correlated rotated output.

8. The method according to claim 1, comprising rotating said received signal based on a phase offset and frequency offset of said received signal and said corresponding transmitted signal.

9. The method according to claim 1, comprising generating one or both of a timing error adjustment signal and/or an angle feedback signal utilizing a rotated output of said single output CORDIC, which is configured in a rotating mode.

10. The method according to claim 9, comprising rotating an output of said single input CORDIC utilizing said angle feedback signal.

11. The method according to claim 1, wherein said amplitude output of said single output CORDIC corresponds to an equalized signal input to said single output CORDIC.

12. The method according to claim 1, comprising determining a phase offset of said received signal and a corresponding transmitted signal utilizing an angle output of said single output CORDIC, which is configured in said ARCTAN mode.

13. The method according to claim 12, wherein said angle output of said single output CORDIC corresponds to a peak signal input to said single output CORDIC.

14. The method according to claim 1, comprising filtering an angle generated at an output of said single output CORDIC, which is configured in said ARCTAN mode.

15. The method according to claim 14, wherein said angle generated at said output of said single output CORDIC corresponds to an equalized signal input to said single output CORDIC.

16. The method according to claim 1, comprising generating a plurality of bits utilizing an angle generated at an output of said single output CORDIC, wherein said plurality of bits corresponds to said received signal.

17. The method according to claim 16, wherein said angle generated from said output of said single output CORDIC corresponds to an equalized signal input to said single output CORDIC.

18. The method according to claim 1, wherein said dual CORDIC architecture circuit is implemented as a single chip.

19. The method according to claim 1, comprising determination of an optimal sampling point for a start of said demodulation, which is based on said amplitude output signal from said single output CORDIC.

20. A non-transitory computer-readable medium having stored thereon, a computer program having at least one code section for processing an RF signal, the at least one code section being executable by a machine to perform steps comprising utilizing a dual Coordinate Rotation Digital Computer (CORDIC) architecture circuit for phase and frequency synchronization and demodulation of a received signal, said dual CORDIC architecture circuit comprising a single input CORDIC and a single output CORDIC, wherein said received signal comprises a plurality of bit rates, and wherein said synchronization is based on a frequency difference between said received signal and a transmitted signal corresponding to said received signal;
generating, by said single output CORDIC utilizing an output of said single input CORDIC, an amplitude output; and
generating a received signal strength indicator(RSSI) signal utilizing said amplitude output of said single output CORDIC, said single output CORDIC being configured in one or both of a rotating mode and/or an arctangent (ARCTAN) mode.

21. The non-transitory computer-readable medium according to claim 20, wherein said received signal comprises a one megabit per second (Mbps) signal.

22. The non-transitory computer-readable medium according to claim 20, comprising code for configuring said single input CORDIC to operate in a rotating mode.

23. The non-transitory computer-readable medium according to claim 20, comprising code for configuring said single output CORDIC to operate in one or both of said rotating mode and/or said arctangent (ARCTAN) mode.

24. The non-transitory computer-readable medium according to claim 20, comprising code for correlating a rotated output of said single input CORDIC with a phase shift keying (PSK) synchronization (sync) word.

25. The non-transitory computer-readable medium according to claim 24, comprising code for buffering at least a portion of said correlated rotated output of said single input CORDIC.

26. The non-transitory computer-readable medium according to claim 25, comprising code for determining at least one signal peak utilizing an amplitude output signal of said single output CORDIC, wherein said amplitude output signal corresponds to at least a portion of said correlated rotated output and a portion of said buffered correlated rotated output.

27. The non-transitory computer-readable medium according to claim 20, comprising code for rotating said received signal based on a phase offset and frequency offset of said received signal and said corresponding transmitted signal.

28. The non-transitory computer-readable medium according to claim 20, comprising code for generating one or both of a timing error adjustment signal and/or an angle feedback signal utilizing a rotated output of said single output CORDIC, which is configured in a rotating mode.

29. The non-transitory computer-readable medium according to claim 28, comprising code for rotating an output of said single input CORDIC utilizing said angle feedback signal.

30. The non-transitory computer-readable medium according to claim 20, wherein said amplitude output of said single output CORDIC corresponds to an equalized signal input to said single output CORDIC.

31. The non-transitory computer-readable medium to claim 20, comprising code for determining a phase offset of said received signal and a corresponding transmitted signal utilizing an angle output of said single output CORDIC, which is configured in said ARCTAN mode.

32. The non-transitory computer-readable medium according to claim 31, wherein said angle output of said single output CORDIC corresponds to a peak signal input to said single output CORDIC.

33. The non-transitory computer-readable medium according to claim 20, comprising code for filtering an angle generated at an output of said single output CORDIC, which is configured in said ARCTAN mode.

34. The non-transitory computer-readable medium according to claim 33, wherein said angle generated at said output of said single output CORDIC corresponds to an equalized signal input to said single output CORDIC.

35. The non-transitory computer-readable medium according to claim 20, comprising code for generating a plurality of bits utilizing an angle generated at an output of said single output CORDIC, wherein said plurality of bits corresponds to said received signal.

36. The non-transitory computer-readable medium according to claim 35, wherein said angle generated from said output of said single output CORDIC corresponds to an equalized signal input to said single output CORDIC.

37. The non-transitory computer-readable medium according to claim 20, wherein said dual CORDIC architecture circuit is implemented as a single chip.

38. The non-transitory computer-readable medium according to claim 20, comprising determination of an optimal sampling point for a start of said demodulation, which is based on said amplitude output signal from said single output CORDIC.

39. A system for processing an RF signal, the system comprising a dual Coordinate Rotation Digital Computer (CORDIC) architecture circuit for phase and frequency synchronization and demodulation of a received signal, said dual CORDIC architecture circuit comprising a single input CORDIC and a single output CORDIC, wherein said received signal comprises a plurality of bit rates, and wherein said synchronization is based on a frequency difference between said received signal and a transmitted signal corresponding to said received signal;
said single output CORDIC being operable to generate, utilizing an output of said input CORDIC, an amplitude output; and
said system being operable to generate a received signal strength indicator(RSSI) signal utilizing said amplitude output of said single output CORDIC, said single output CORDIC being configured in one or both of a rotating mode and/or an arctangent (ARCTAN) mode.

40. The system according to claim 39, wherein said received signal comprises a one megabit per second (Mbps) signal.

41. The system according to claim 39, wherein said single input CORDIC is configured to operate in a rotating mode.

42. The system according to claim 39, wherein the system is operable to configure said single output CORDIC to operate in said one or both of said rotating mode and/or said ARCTAN mode.

43. The system according to claim 39, comprising a correlator that correlates a rotated output of said single input CORDIC with a phase shift keying (PSK) synchronization (sync) word.

44. The system according to claim 43, comprising a buffer that buffers at least a portion of said correlated rotated output of said single input CORDIC.

45. The system according to claim 44, comprising a peak detector that determines at least one signal peak utilizing an amplitude output signal of said single output CORDIC, wherein said amplitude output signal corresponds to at least a portion of said correlated rotated output and a portion of said buffered correlated rotated output.

46. The system according to claim 39, wherein said single input CORDIC rotates said received signal based on a phase offset and frequency offset of said received signal and said corresponding transmitted signal.

47. The system according to claim 39, comprising a timing error detector (TED) that generates one or both of a timing error adjustment signal and/or an angle feedback signal utilizing a rotated output of said single output CORDIC, which is configured in a rotating mode.

48. The system according to claim 47, wherein said single output CORDIC rotates an output of said single input CORDIC utilizing said angle feedback signal.

49. The system according to claim 39, wherein said amplitude output of said single output CORDIC corresponds to an equalized signal input to said single output CORDIC.

50. The system according to claim 39, comprising an initial phase offset circuit that determines a phase offset of said received signal and a corresponding transmitted signal utilizing an angle output of said single output CORDIC, which is configured in said ARCTAN mode.

51. The system according to claim 50, wherein said angle output of said single output CORDIC corresponds to a peak signal input to said single output CORDIC.

52. The system according to claim 39, comprising a filter that filters an angle generated at an output of said single output CORDIC, which is configured in said ARCTAN mode.

53. The system according to claim 52, wherein said angle generated at said output of said single output CORDIC corresponds to an equalized signal input to said single output CORDIC.

54. The system according to claim 39, comprising a PSK slicer that generates a plurality of bits utilizing an angle generated at an output of said single output CORDIC, wherein said plurality of bits corresponds to said received signal.

55. The system according to claim 54, wherein said angle generated from said output of said single output CORDIC corresponds to an equalized signal input to said single output CORDIC.

56. The system according to claim 39, wherein said dual CORDIC architecture circuit is implemented as a single chip.

57. The system according to claim 39, wherein said single output CORDIC outputs said amplitude output signal for determination of an optimal sampling point for a start of said demodulation.

* * * * *